(12) United States Patent
Ent et al.

(10) Patent No.: US 9,625,960 B1
(45) Date of Patent: Apr. 18, 2017

(54) CONVERTIBLE HARD DRIVE TRAY

(71) Applicant: Lenovo (Singapore) Pte. Ltd., Singapore (SG)

(72) Inventors: Ali Kathryn Ent, Raleigh, NC (US); Rodrigo Samper, Raleigh, NC (US); Shuang Li, Guangdong (CN); Chen Jianyang, Guangdong (CN)

(73) Assignee: Lenovo (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/086,285

(22) Filed: Mar. 31, 2016

(51) Int. Cl.
  *G06F 1/16* (2006.01)
  *G06F 1/18* (2006.01)
  *H05K 5/02* (2006.01)

(52) U.S. Cl.
  CPC .......... *G06F 1/187* (2013.01); *H05K 5/0226* (2013.01)

(58) Field of Classification Search
  CPC ..................................................... G06F 1/187
  USPC .......... 361/679.33–679.39; 312/223.1, 223.2
  See application file for complete search history.

(56) References Cited

U.S. PATENT DOCUMENTS

| | | | | |
|---|---|---|---|---|
| 8,164,896 B1* | 4/2012 | Wang | .................... | G06F 1/1658 361/679.33 |
| 2011/0176272 A1* | 7/2011 | Hsiao | .................... | G06F 1/187 361/679.37 |
| 2012/0268889 A1* | 10/2012 | Ganta | .................. | G11B 33/128 361/679.33 |
| 2013/0058033 A1* | 3/2013 | Hu | ....................... | G11B 33/124 361/679.33 |
| 2015/0022964 A1* | 1/2015 | Ding | ..................... | G11B 33/02 361/679.39 |

* cited by examiner

*Primary Examiner* — Nidhi Thaker
(74) *Attorney, Agent, or Firm* — Ference & Associates LLC

(57) ABSTRACT

One embodiment provides an apparatus, including: a processor; a hard drive operatively coupled to the processor; and a tray that houses the hard drive; said tray comprising a bottom, a first side, a second side, and a pivotable planar element; wherein the pivotable planar element rotates relative to the bottom to relocate from the bottom of the tray to a side of the tray. Other embodiments are described and claimed.

16 Claims, 8 Drawing Sheets

CONVERTIBLE HARD DRIVE TRAY

BACKGROUND

Electronic components such as hard drives (hard disk drives, herein "HDD(s)") are often provided within a tray that attaches the component, e.g., HDD, within a system (e.g., housing of a laptop or desktop computer). Electronic components come in different physical sizes. For example, common sizes for HDDs are 2.5 inches and 3.5 inches.

Conventionally, different size HDDs require addition of an additional bracket to a tray of one size (i.e., a tray for the 3.5" HHD) in order to hold an HDD of another size, e.g., a 2.5" HDD. Alternatively, a combination tray can hold a 3.5" HDD and/or a 2.5" HDD, but since the supports of the combination tray are stacked on top of one another, it makes the tray much larger (e.g., taller) than an individual tray, and thus such combination trays do not fit in a standard sized HDD bay within a system.

BRIEF SUMMARY

In summary, one aspect provides an apparatus, comprising: a processor; a hard drive operatively coupled to the processor; and a tray that houses said hard drive; said tray comprising a bottom, a first side, a second side, and a pivotable planar element; wherein said pivotable planar element rotates relative to said bottom to relocate from the bottom of the tray to a side of the tray.

Another aspect provides a hard drive tray, comprising: a tray; said tray comprising a bottom, a first side, a second side, and a pivotable planar element; wherein said pivotable planar element rotates relative to said bottom to relocate from the bottom of the tray to a side of the tray.

A further aspect provides a kit, comprising: a hard drive tray, comprising: a bottom, a first side, a second side, and a planar element attached to a hinge; wherein, in a bottom position, said planar element lies flat on the bottom of the tray to form a first tray opening that accommodates a first hard drive size; wherein said planar element rotates about said hinge to relocate from a bottom of the tray to a side of the tray; and wherein, in said side position, said planar element forms a resized tray opening that houses a different hard drive size; said kit comprising a hard drive of a size selected from the group consisting of the first hard drive size and the different hard drive size.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the invention will be pointed out in the appended claims.

DETAILED DESCRIPTION

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

The illustrated example embodiments will be best understood by reference to the figures. The following description is intended only by way of example, and simply illustrates certain example embodiments.

An embodiment provides a component tray (e.g., HDD tray) that changes its shape and thus permits housing of different sized components. In an embodiment, an HDD tray is provided that includes planar elements that are hinged. The planar elements rotate about the hinge(s) or joints to form two HDD openings for accommodating two different sized HDDs therein. The tray permits the components, e.g., HDDs, to be secured within a system, for example to be included within a system having circuitry as outlined in the example of FIG. 1.

Figure 1:
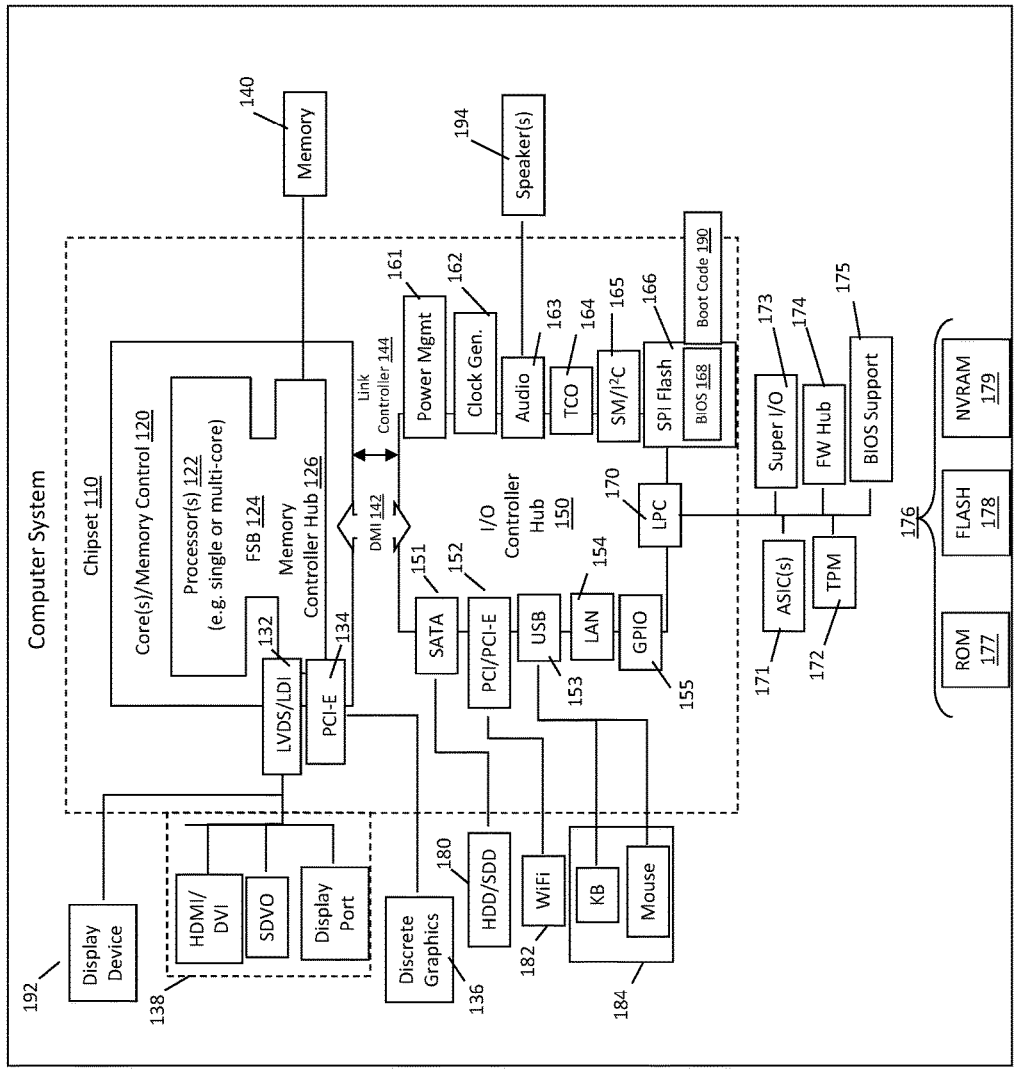
FIG. 1 illustrates an example of information handling device circuitry.

FIG. 1 depicts a block diagram of another example of device or system circuits, circuitry or components. The example depicted in FIG. 1 may correspond to computing systems such as the THINKPAD series of personal computers sold by Lenovo (US) Inc. of Morrisville, N.C., or other devices. As is apparent from the description herein, embodiments may include other features or only some of the features of the example illustrated in FIG. 1.

The example of FIG. 1 includes a so-called chipset 110 (a group of integrated circuits, or chips, that work together, chipsets) with an architecture that may vary depending on manufacturer (for example, INTEL, AMD, ARM, etc.). INTEL is a registered trademark of Intel Corporation in the United States and other countries. AMD is a registered trademark of Advanced Micro Devices, Inc. in the United States and other countries. ARM is an unregistered trademark of ARM Holdings plc in the United States and other countries. The architecture of the chipset 110 includes a core and memory control group 120 and an I/O controller hub 150 that exchanges information (for example, data, signals, commands, etc.) via a direct management interface (DMI) 142 or a link controller 144. In FIG. 1, the DMI 142 is a chip-to-chip interface (sometimes referred to as being a link between a "northbridge" and a "southbridge"). The core and memory control group 120 include one or more processors 122 (for example, single or multi-core) and a memory controller hub 126 that exchange information via a front side bus (FSB) 124; noting that components of the group 120 may be integrated in a chip that supplants the conventional "northbridge" style architecture. One or more processors 122 comprise internal arithmetic units, registers, cache memory, busses, I/O ports, etc., as is well known in the art.

In FIG. 1, the memory controller hub 126 interfaces with memory 140 (for example, to provide support for a type of RAM that may be referred to as "system memory" or "memory"). The memory controller hub 126 further includes a low voltage differential signaling (LVDS) interface 132 for a display device 192 (for example, a CRT, a flat panel, touch screen, etc.). A block 138 includes some technologies that may be supported via the LVDS interface 132 (for example, serial digital video, HDMI/DVI, display port). The memory controller hub 126 also includes a PCI-express interface (PCI-E) 134 that may support discrete graphics 136.

In FIG. 1, the I/O hub controller 150 includes a SATA interface 151 (for example, for HDDs, SDDs, etc., 180), a PCI-E interface 152 (for example, for wireless connections 182), a USB interface 153 (for example, for devices 184 such as a digitizer, keyboard, mice, cameras, phones, microphones, storage, other connected devices, etc.), a network interface 154 (for example, LAN), a GPIO interface 155, a LPC interface 170 (for ASICs 171, a TPM 172, a super I/O 173, a firmware hub 174, BIOS support 175 as well as various types of memory 176 such as ROM 177, Flash 178, and NVRAM 179), a power management interface 161, a clock generator interface 162, an audio interface 163 (for example, for speakers 194), a TCO interface 164, a system management bus interface 165, and SPI Flash 166, which can include BIOS 168 and boot code 190. The I/O hub controller 150 may include gigabit Ethernet support.

The system, upon power on, may be configured to execute boot code 190 for the BIOS 168, as stored within the SPI Flash 166, and thereafter processes data under the control of one or more operating systems and application software (for example, stored in system memory 140). An operating system may be stored in any of a variety of locations and accessed, for example, according to instructions of the BIOS 168. As described herein, a device may include fewer or more features than shown in the system of FIG. 1.

Device circuitry, as for example outlined in FIG. 1, may be used in devices such as laptop or desktop computers that include an HDD 180. The HDD 180 may be provided in a tray that attaches the HDD 180 to a bay within a system to operatively couple the HDD to the system for use in data storage.

Figure 2:
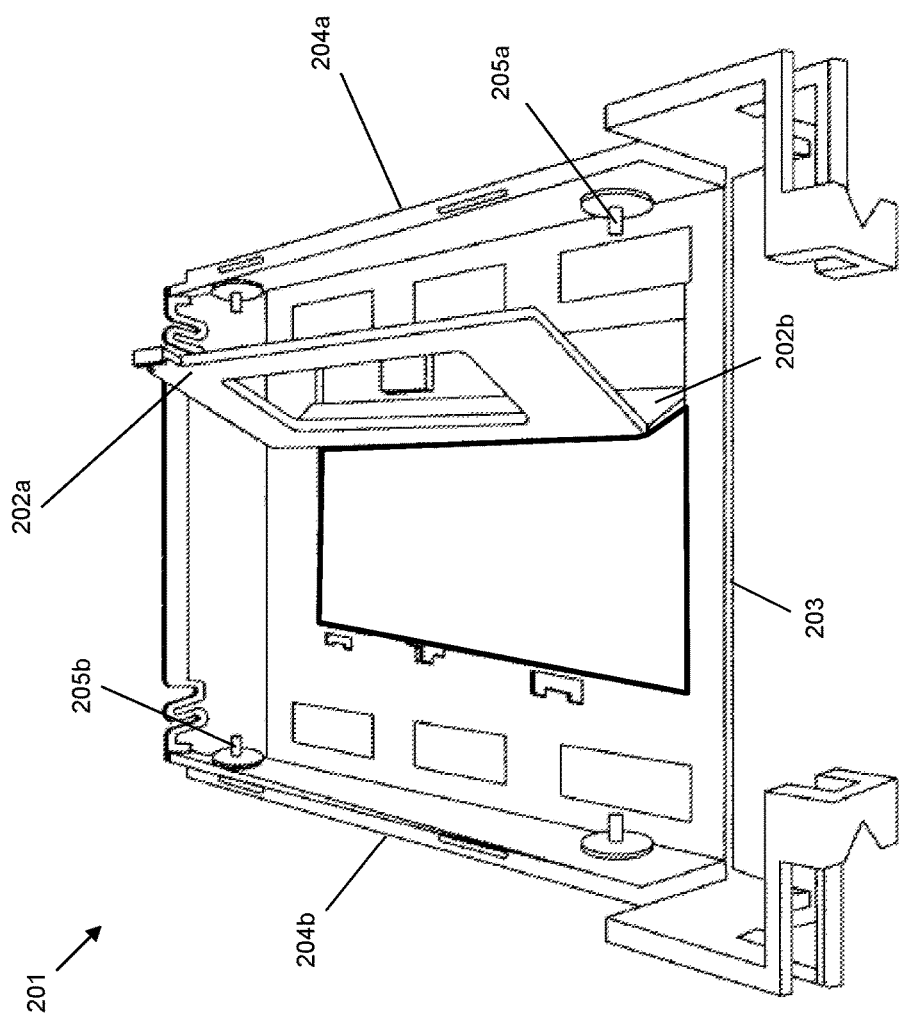
FIG. 2 illustrates an example HDD tray with an articulating, planar element.

Shown in FIG. 2 is an example HDD tray with an articulating, planar element. Specifically, the tray 201 has a bottom 203 and two lateral sides 204a, 204b. The planar elements 202a, 202b are attached to part of the bottom 203 such that the planar elements 202a, 202b may articulate, e.g., about a joint or connecting part, as shown.

The function of the planar elements 202a, 202b is to lie flat in a first, bottom position, so as to provide a larger opening within the tray 201 for accommodating a larger HDD, e.g., a 3.5" HDD. The larger HDD may be secured by pins, e.g., 205a, 205b that are provided in the sides, 204a, 204b, respectively, of the tray 201.

The planar elements 202a, 202b, may be rotated from the first, bottom position into a second, side position. The planar elements 202a, 202b are shown in a partially articulated position in FIG. 2, i.e., in transit between the first, bottom position and the second, side position.

Figure 3:
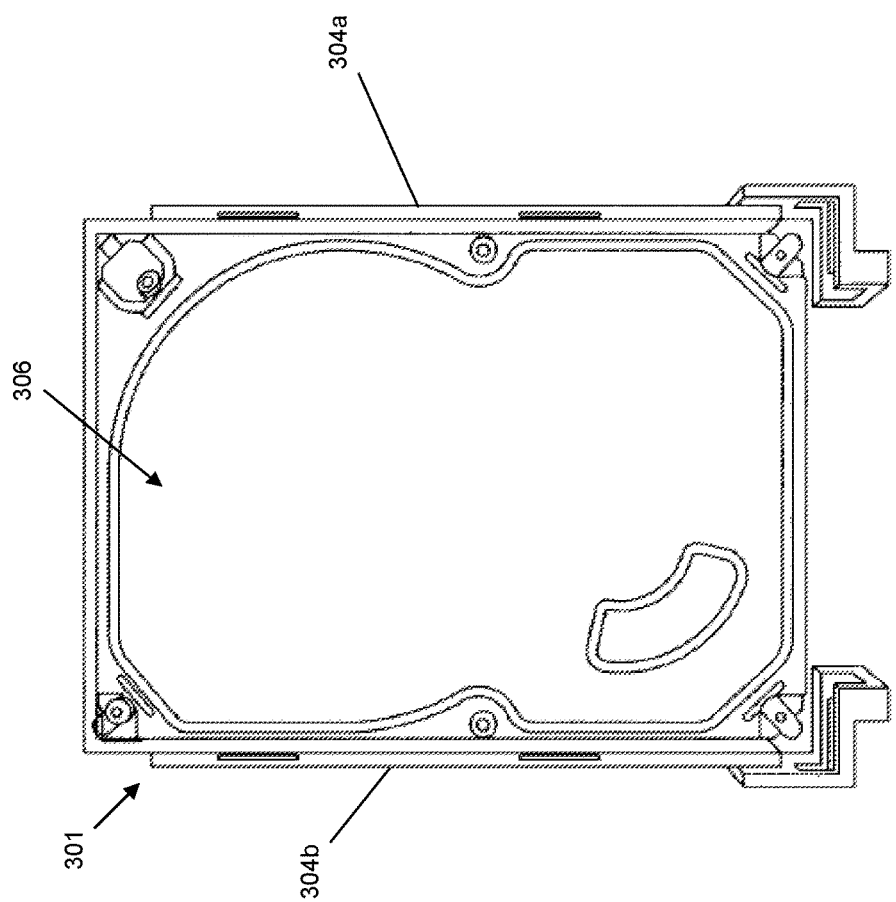
FIG. 3 illustrates the HDD tray of FIG. 2 where the articulating planar element has been laid flat against the bottom of the tray and the tray has a 3.5" HDD therein.

FIG. 3 illustrates the HDD tray of FIG. 2, where the articulating planar elements have been laid flat against the bottom of the tray and the tray has a 3.5" HDD therein. Specifically as shown, the HDD 305 is secured within the tray 301 and is seated in the tray using sides 304a, 304b that accommodate its width dimension, i.e., 3.5" in this example.

Figure 4:
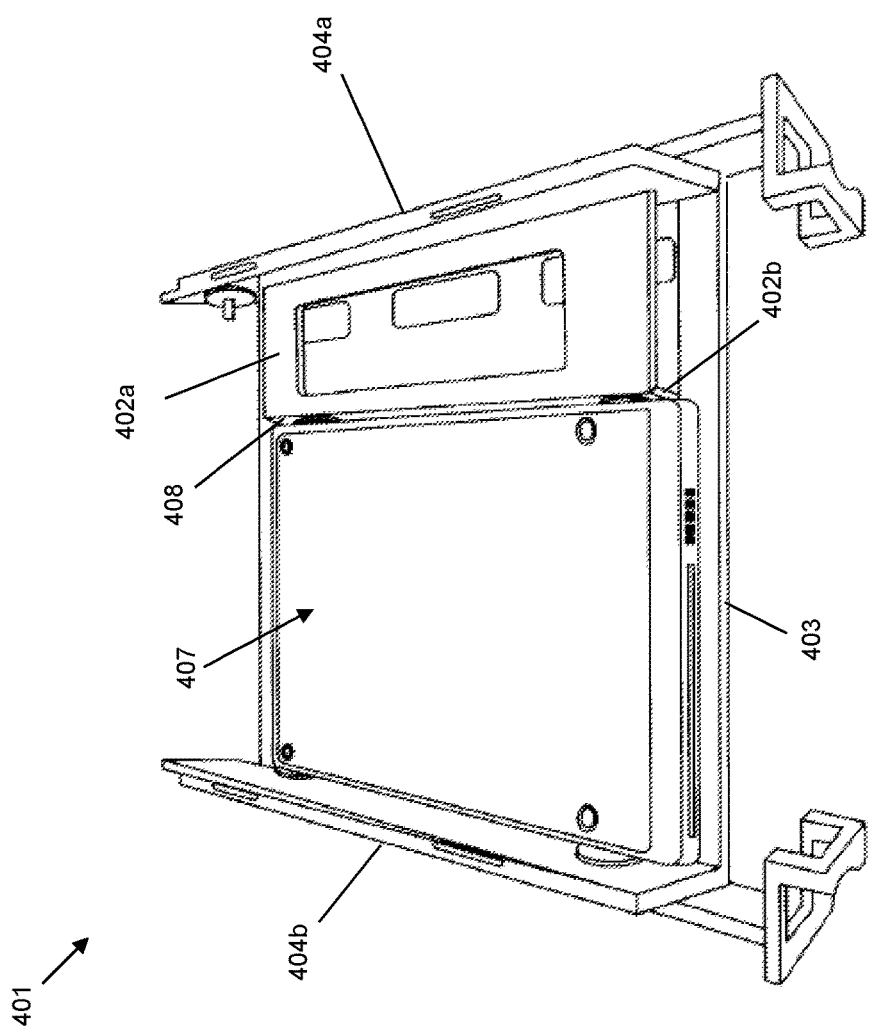
FIG. 4 illustrates the HDD tray of FIG. 2 where the articulating, planar element has been moved and attached into a side position and the tray has a 2.5" HDD therein.

FIG. 4 illustrates the HDD tray of FIG. 2 where the articulating, planar elements 402a, 402b have been moved from the first, bottom position into a second, side position and attached into a side 404a. This creates an opening in the tray 401 that accommodates a different, smaller HDD 407, i.e., a 2.5" HDD used in this example. As shown, one of the planar elements 402a articulates about another planar element 402b to attach into side 404a. The planar element 402a may be secured into position, e.g., using a series of latches or other connections. The other planar element 402b rotates about a connection with the bottom 403 of the tray 401 to form a new side 408.

Figure 5:
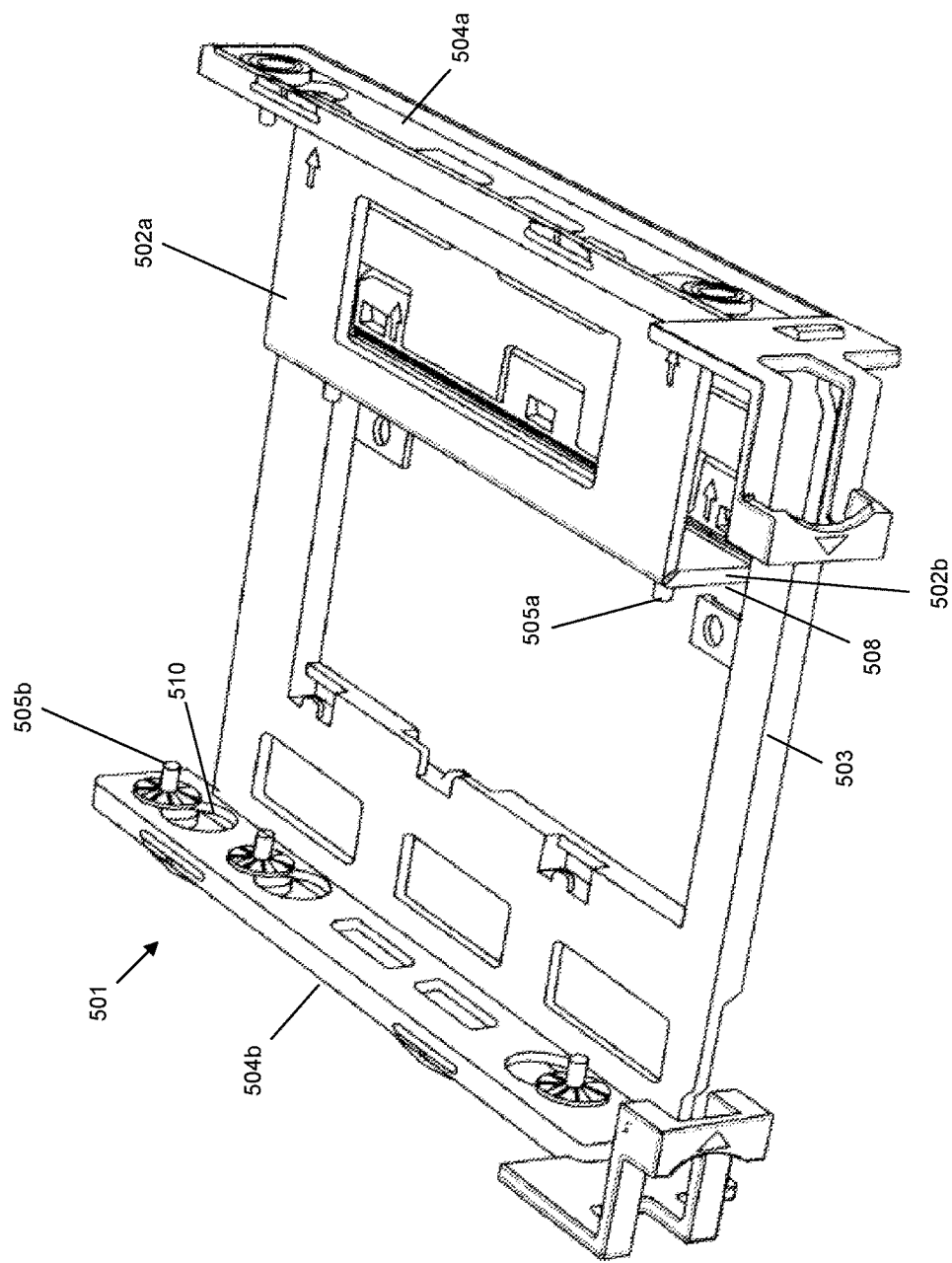
FIG. 5 illustrates a perspective view of the HDD tray of FIG. 4 where the 2.5" HDD has been removed.

FIG. 5 illustrates a perspective view of a HDD tray where the 2.5" HDD has been removed. Specifically, the planar element 502a has been moved from the bottom 503 of the tray 501 to a side 504a of the tray. The planar element 502a is detachable from the bottom 503 of the tray 501 and may be snapped into place in the side 504a of the tray 501. When in this second, side position, the planar element 502b forms a new side wall 508 in the tray to accommodate a smaller HDD (not shown).

The smaller HDD may be secured into place using pins 505a, 505b, where pins, e.g., 505b, may be provided on a side 504b of the tray 501 proper, and pins, e.g., 505a, may be provided in the planar element 502b, e.g., along the new side wall 508 formed by the planar element 502b. As shown, a pin, e.g., 505b, may be inserted through an aperture 510 and snapped into place, as further described in connection with FIG. 6.

Figure 6:
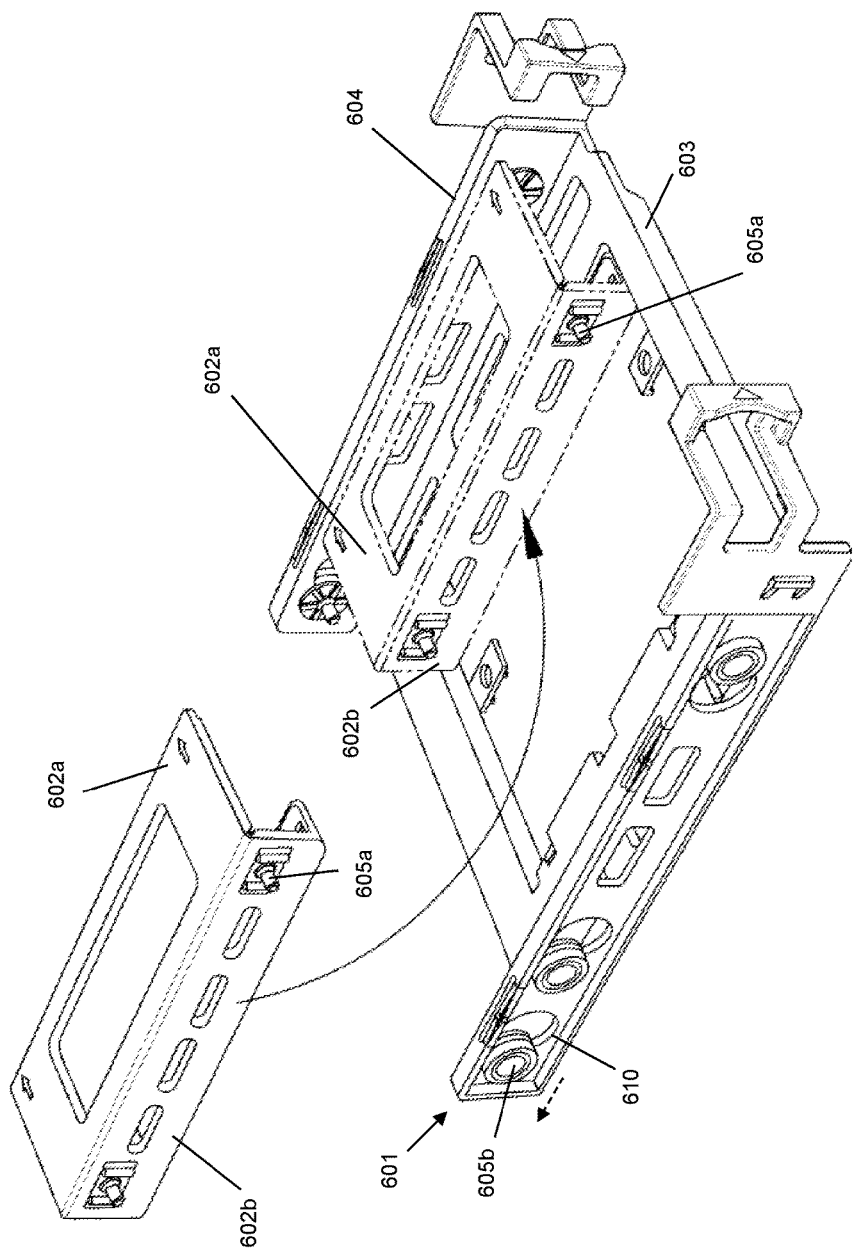
FIG. 6 illustrates a perspective view of the HDD tray of FIG. 5 where the articulating, planar element has been detached from the tray.

FIG. 6 illustrates a perspective view of the HDD tray of FIG. 5 where the planar elements 602a, 602b have been removed from the tray 601. The planar elements 602a, 602b may be secured to the tray 601 via snapping planar element 602b into place along the bottom 603 of the tray and snapping planar element 602a into place along the side 604 of the tray. The planar element 602b includes pins, e.g., pin 605a, to secure a smaller sized HDD, e.g., a 2.5" HDD (not shown in FIG. 6).

As described in connection with FIG. 5, an embodiment permits the pins, e.g., pin 605b, to be inserted through an aperture 610 and slid into a secured position, as indicated by the dashed arrow in FIG. 6. This permits easy insertion, removal, and repositioning of pins within the tray 601 to accommodate various sizes of HDDs and various pin arrangements.

Figure 7A:
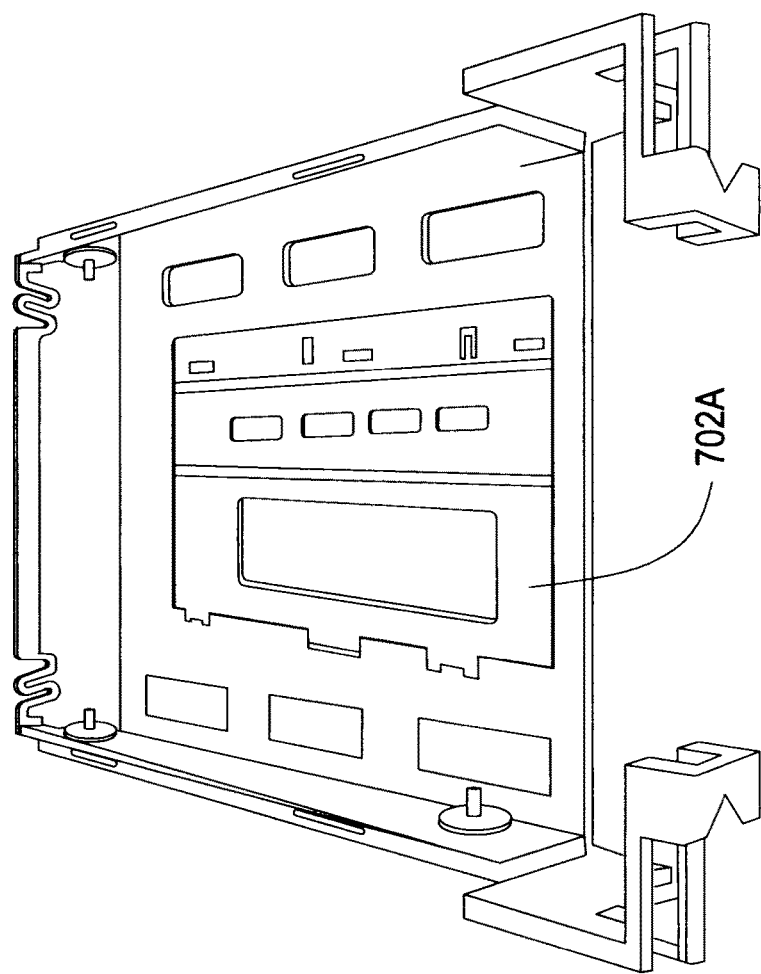
FIG. 7(A-B) illustrates views of the HDD tray.
Figure 7B:
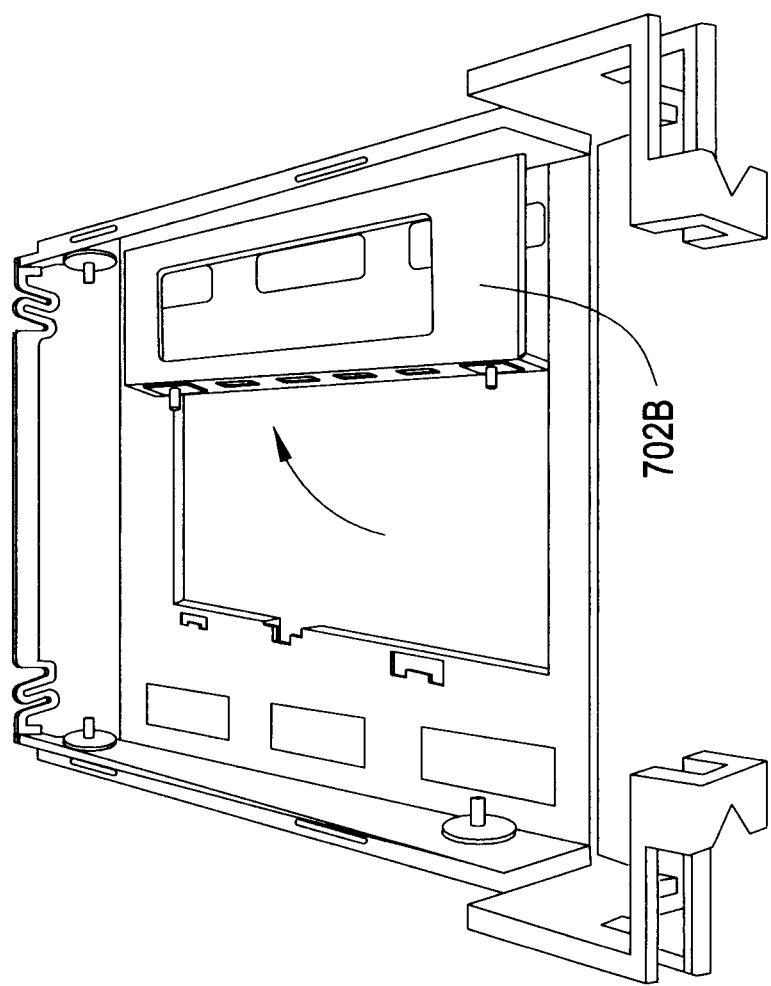

FIG. 7(A-B) illustrates example views of a HDD tray in which a planar element has been repositioned from a bottom position to a side position. Specifically, FIG. 7A illustrates a HDD tray where planar element 702a is in a bottom position, i.e., accommodating a larger sized HDD, e.g., a 3.5" HDD. FIG. 7B illustrates the HDD tray where planar element 702*b* is in the side position, i.e., accommodating a smaller sized HDD, e.g., a 2.5" HDD. As shown in FIG. 7A, a plurality of pins (four are shown) are provided on sides of the HDD tray. As shown in FIG. 7B, a plurality of pins (four are shown) are provided on the sides of the HDD tray, with the underside of the planar element 702*b* forming a new side and providing two of the pins.

As used herein, the singular "a" and "an" may be construed as including the plural "one or more" unless clearly indicated otherwise.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

What is claimed is:

1. An apparatus, comprising: a processor; a hard drive operatively coupled to the processor; and a tray that houses said hard drive; said tray comprising a bottom, a first side, a second side, and a pivotable planar element; wherein said pivotable planar element rotates relative to said bottom to relocate from the bottom of the tray to a side of the tray; wherein, in a side position, said pivotable planer element forms a resized tray opening that houses a different hard drive; and wherein, in a bottom position, said pivotable planar element lies flat on the bottom of the tray to form a first tray opening that accommodates the hard drive.

2. The apparatus of claim 1, wherein the pivotable planar element extends from the bottom.

3. The apparatus of claim 1, wherein said different hard drive is about 2.5 inches along one dimension.

4. The apparatus of claim 3, wherein said hard drive is about 3.5 inches along one dimension.

5. The apparatus of claim 1, wherein said pivotable planar element comprises two or more planar elements.

6. The apparatus of claim 5, wherein said two or more planar elements are attached to one another.

7. A hard drive tray, comprising: a tray; said tray comprising a bottom, a first side, a second side, and a pivotable planar element; wherein said pivotable planar element rotates relative to said bottom to relocate from the bottom of the tray to a side of the tray; wherein, in a side position, said pivotable planar element forms a resized tray opening that houses a different hard drive size; and wherein, in a bottom position, said pivotable planar element lies flat on the bottom of the tray to form a first tray opening that accommodates a first hard drive.

8. The hard drive tray of claim 7, wherein the pivotable planar element extends from the bottom.

9. The hard drive tray of claim 7, wherein said different hard drive is about 2.5 inches along one dimension.

10. The hard drive tray of claim 7, wherein said pivotable planar element comprises two or more planar elements.

11. The hard drive tray of claim 10, wherein said two or more planar elements are attached to one another.

12. A kit, comprising:
 a hard drive tray, comprising:
  a bottom, a first side, a second side, and a planar element attached to a hinge;
 wherein, in a bottom position, said planar element lies flat on the bottom of the tray to form a first tray opening that accommodates a first hard drive size;
 wherein said planar element rotates about said hinge to relocate from a bottom of the tray to a side of the tray; and
 wherein, in said side position, said planar element forms a resized tray opening that houses a different hard drive size;
 said kit comprising a hard drive of a size selected from the group consisting of the first hard drive size and the different hard drive size.

13. The kit of claim 12, wherein said different hard drive is smaller than said first hard drive.

14. The kit of claim 13, wherein said different hard drive is about 2.5 inches along one dimension, and further wherein said hard drive is about 3.5 inches along one dimension.

15. The kit of claim 12, wherein:
 said planar element comprises two or more planar elements;
 said two or more planar elements are attached to one another by a hinge; and
 wherein said two or more planar elements articulate about one anther to form a box arrangement defining said resized tray opening that houses the different hard drive.

16. The kit of claim 15, wherein at least one of the two or more planar elements includes an aperture for attaching a pin via the aperture.

* * * * *